(12) United States Patent
Sugitani et al.

(10) Patent No.: US 9,795,037 B2
(45) Date of Patent: Oct. 17, 2017

(54) TOUCH PANEL AND METHOD FOR MANUFACTURING THE SAME

(71) Applicant: Samsung Display Co., Ltd., Yongin-si (KR)

(72) Inventors: Koichi Sugitani, Hwaseong-si (KR); Hoon Kang, Suwon-si (KR); Chul Won Park, Suwon-si (KR); Yang-Ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 23 days.

(21) Appl. No.: 14/924,020

(22) Filed: Oct. 27, 2015

(65) Prior Publication Data

US 2016/0299609 A1    Oct. 13, 2016

(30) Foreign Application Priority Data

Apr. 9, 2015 (KR) .......................... 10-2015-0050354

(51) Int. Cl.
*H05K 3/06* (2006.01)
*G06F 3/041* (2006.01)
*H05K 3/00* (2006.01)

(52) U.S. Cl.
CPC ............. *H05K 3/06* (2013.01); *G06F 3/0416* (2013.01); *H05K 3/007* (2013.01); *H05K 3/064* (2013.01); *G06F 2203/04103* (2013.01); *H05K 2201/0145* (2013.01); *H05K 2201/026* (2013.01); *H05K 2201/0323* (2013.01); *H05K 2201/0326* (2013.01); *H05K 2201/0329* (2013.01); *H05K 2201/10128* (2013.01); *H05K 2203/016* (2013.01)

(58) Field of Classification Search
CPC .......... H05K 3/06; H05K 3/467; H05K 3/007; H05K 3/064; H05K 2201/0145; H05K 2201/026; H05K 2201/0323; H05K 2201/0326; H05K 2201/0329; H05K 2201/10128; H05K 2203/016; G06F 3/0416; G06F 3/041; G06F 3/0412; G06F 2203/04103
See application file for complete search history.

(56) References Cited

U.S. PATENT DOCUMENTS 8,723,278 B2 * 5/2014 Lai .................... G06F 3/044
257/290
9,128,578 B2   9/2015 Omote et al.
(Continued)

FOREIGN PATENT DOCUMENTS

JP    2007129083    5/2007
JP    2009224653    10/2009
(Continued)

*Primary Examiner* — Tom Sheng
(74) *Attorney, Agent, or Firm* — H.C. Park & Associates, PLC

(57) ABSTRACT

A touch panel includes: a uni-axially oriented base film; a transparent electrode pattern layer positioned on the uni-axially oriented base film; a first passivation layer formed in an edge region of the transparent electrode pattern layer and covering end portion side walls of the transparent electrode pattern layer; and a contact hole positioned on the first passivation layer and exposing the first passivation layer.

11 Claims, 25 Drawing Sheets

(56) References Cited

U.S. PATENT DOCUMENTS

| | | | |
|---|---|---|---|
| 2011/0316809 A1* | 12/2011 | Kim | G06F 3/0412 345/174 |
| 2013/0038545 A1* | 2/2013 | Hsu | G06F 3/041 345/173 |
| 2013/0057495 A1* | 3/2013 | Wang | G06F 3/044 345/173 |
| 2013/0257774 A1* | 10/2013 | Kim | H01L 27/1259 345/173 |
| 2014/0240616 A1* | 8/2014 | Huang | G06F 1/1692 349/12 |
| 2015/0227235 A1* | 8/2015 | Lee | G06F 3/044 345/174 |

FOREIGN PATENT DOCUMENTS

| | | |
|---|---|---|
| JP | 2010224426 | 10/2010 |
| JP | 2012145645 | 8/2012 |
| JP | 5234868 | 7/2013 |

\* cited by examiner

TOUCH PANEL AND METHOD FOR MANUFACTURING THE SAME

CROSS-REFERENCE TO RELATED APPLICATION

This application claims priority from and the benefit of Korean Patent Application No. 10-2015-0050354, filed on Apr. 9, 2015, which is hereby incorporated by reference for all purposes as if fully set forth herein.

BACKGROUND

Field

Exemplary embodiments relate to a touch panel and a method for manufacturing the same.

Discussion of the Background

An electronic device such as a liquid crystal display (LCD), an organic light emitting diode (OLED) display, an electrophoretic display, and the like, may include a touch sensor enabling an interaction with a user. The touch sensor may recognize contact information such as whether or not an object approaches or contacts the electronic display, a contact position, and the like. The touch sensor may allow a display device to sense changes in screen pressure, electric charges, light, and the like, when a user approaches or contacts the touch surface to, for example, write a character or draw a picture, using a finger, a touch pen, etc.

The touch sensor of several electronic devices may be variously classified into a resistive type touch sensor, a capacitive type touch sensor, an electro-magnetic (EM) type touch sensor, an optical type touch sensor, and the like.

For example, the capacitive type touch sensor may include a sensing capacitor including a plurality of sensing electrodes that may transfer detection signals and may sense a change in a capacitance or a charged electric charge of the sensing capacitor generated when a conductor such as a finger approaches the touch sensor, thereby detecting whether or not a touch is made, a touch position, and the like. The capacitive type touch sensor may include a plurality of touch electrodes disposed in a touch sensing region in which the touch may be sensed and touch wirings connected to the touch electrodes. The touch wirings may transfer sensing input signals to the touch electrodes or transfer sensing output signals of the touch electrodes generated by user touch to a touch driver.

The touch sensor may be embedded in the display device (in-cell type), or may be directly formed on an outer surface of the display device (on-cell type), or a separate touch sensor unit may be added and used on the display device (add-on cell type). Particularly, in the case of a flexible display device, a method for forming a separate touch sensor having a shape of a film or a plate on which the touch sensor is formed or a separate touch sensor and then adding the film or the separate touch sensor on the display panel may be used.

In the case in which a glass substrate, which is heavy and easily damaged, is used in electronic devices such as the display device, a touch sensor device, and the like, there is a limitation in portability and displaying a large screen. Therefore, recently, a flexible electronic device in which a film having a light weight, impact resistance, and high flexibility is used as a material of the substrate has been actively developed.

However, in a process for forming a touch sensor and wiring patterns on the flexible substrate made of film, a crack may be generated in an edge region of the substrate, such that touch performance of the touch panel is deteriorated.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a touch panel and a method for manufacturing the same capable of preventing a crack from being generated in both end portions of a base film along an elongation direction.

Additional aspects will be set forth in the detailed description which follows, and, in part, will be apparent from the disclosure, or may be learned by practice of the inventive concept.

An exemplary embodiment discloses a touch panel, including: a uni-axially oriented base film; a transparent electrode pattern layer positioned on the uni-axially oriented base film; a first passivation layer formed in an edge region of the transparent electrode pattern layer and covering end portion side walls of the transparent electrode pattern layer; and a contact hole positioned on the first passivation layer and exposing the first passivation layer.

An exemplary embodiment also discloses a method for manufacturing a touch panel, including: sequentially forming a transparent electrode layer and a metal layer on a uni-axially oriented base film attached onto a substrate; forming a first photosensitive coating layer on the metal layer; forming a first passivation layer in edge regions of the transparent electrode layer using the first photosensitive coating layer so as to cover end portion side walls of the transparent electrode layer; forming a second photosensitive coating layer on the first passivation layer and the transparent electrode layer; patterning the transparent electrode layer using the second photosensitive coating layer to form a transparent electrode pattern layer; and forming a second passivation layer on the transparent electrode pattern layer and the first passivation layer, the second passivation layer including a contact hole exposing the first passivation layer.

An exemplary embodiment also discloses a method for manufacturing a touch panel, including: attaching a uni-axially oriented base film onto a substrate; sequentially forming a transparent electrode layer and a metal layer on the uni-axially oriented base film; forming a first photosensitive coating layer on the metal layer; patterning the metal layer using the first photosensitive coating layer to form a wiring pattern layer; forming a second photosensitive coating layer on the wiring pattern layer and the transparent electrode layer; patterning the transparent electrode layer using the second photosensitive coating layer to form a transparent electrode pattern layer; and forming a second passivation layer on the wiring pattern layer and the transparent electrode pattern layer, the second passivation layer including a contact hole exposing the wiring pattern layer, wherein the forming of the second photosensitive coating layer is performed so that the second photosensitive coating layer covers the wiring pattern layer and a region in which the second photosensitive coating layer is not formed is included in a predetermined region from an edge of the transparent electrode layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
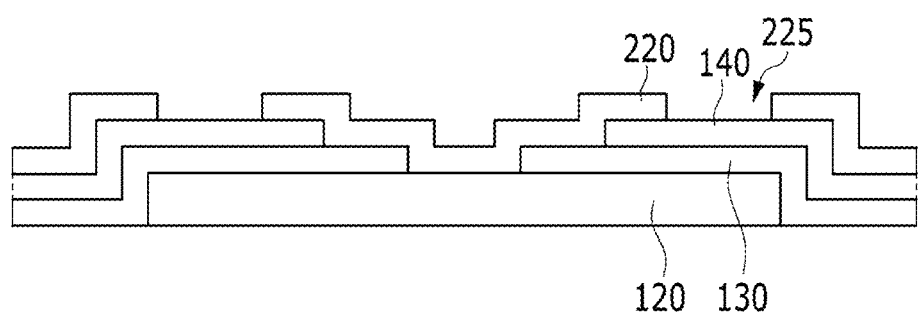
FIG. 1 shows a cross section of a touch panel according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the present disclosure will be described in detail with reference to the accompanying drawings.

FIG. 1 shows a cross section of a touch panel according to an exemplary embodiment.

Referring to FIG. 1, the touch panel according to an exemplary embodiment includes a base film 120, a transparent electrode pattern layer 130, a first passivation layer 140, and contact holes 225.

Hereinafter, the respective components of the touch panel according to an exemplary embodiment of the present disclosure will be described in detail.

The base film 120 may be a plastic film having high flexibility, for example, a polycarbonate film, a polyethylene terephthalate (PET) film, a polyethylene naphthalate film, a polyarylate film, a polyetherimide film, a polyethersulfone film, or a polyimide film, but is not limited thereto.

The base film 120 may be a uni-axially oriented film to improve the strength of the film. Particularly, the base film 120 may be a uni-axially oriented polycarbonate film having excellent optical characteristics.

Next, the transparent electrode pattern layer 130 is formed on the base film 120. The transparent electrode pattern layer 130 forms a touch sensor that may sense a contact in various schemes. For example, the touch sensor may be various types of touch sensors, such as a resistive type touch sensor, a capacitive type touch sensor, an electro-magnetic (EM) type touch sensor, an optical type touch sensor, and the like, but is not particularly limited thereto.

The transparent electrode pattern layer 130 may be made of a transparent conductive oxide such as an indium tin oxide (ITO), an indium zinc oxide (IZO), or the like, but is not limited thereto. That is, the transparent electrode pattern layer 130 may be made of at least one of transparent conductive materials such as a metal nanowire, a conductive polymer such as PEDOT, etc., a metal mesh, a carbon nanotube (CNT), and the like. In the case in which the transparent electrode pattern layer 130 includes a silver nano wire (AgNW), the transparent electrode pattern layer 130 may further include a silver nano wire (AgNW) layer and an upper conductive layer positioned on the silver nano wire layer. The upper conductive layer may include an indium tin oxide (ITO), an indium gallium oxide (IGO), a gallium tin oxide (GTO), or the like.

Next, the first passivation layer 140 is positioned on the transparent electrode pattern layer 130. Here, the first passivation layer 140 is disposed in edge regions of the transparent electrode pattern layer 130 and is formed to cover end portion side walls of the transparent electrode pattern layer 130, as illustrated in FIG. 1. Here, end portions of the transparent electrode pattern layer 130 on which the first passivation layer 140 is disposed may be an entire edge or may be both end portions in the same direction as an elongation direction of the base film 120.

Figure 2:
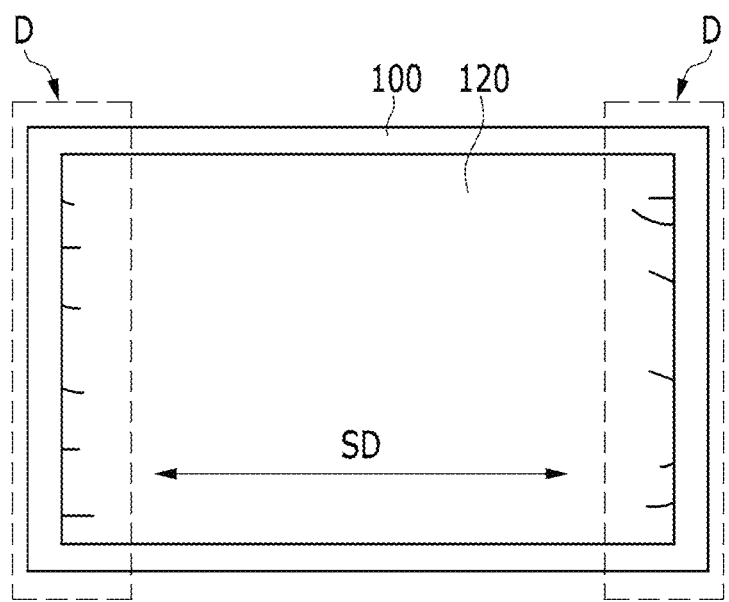
FIG. 2 shows both end portion regions in the same direction as an elongation direction of the base film.

In order to assist in the understanding, a case in which both end portion regions are in the same direction as the elongation direction of the base film is shown in FIG. 2. Referring to FIG. 2, both end portions of the transparent electrode pattern layer 130 may be both end portions D in the same direction as the elongation direction SD of the base film 120 on which the first passivation layer 140 is disposed.

The first passivation layer 140 serves to protect both end portions D in the same direction as the elongation direction SD of the base film 120 in a process for forming the transparent electrode pattern layer. The first passivation layer 140 may include wirings connected to the transparent electrode pattern layer 130.

The first passivation layer 140 may be made of a low resistance material, such as molybdenum (Mo), silver (Ag), titanium (Ti), copper (Cu), aluminum (Al), molybdenum/aluminum/molybdenum (Mo/Al/Mo), or the like.

According to comparative embodiments, a crack may be generated in both end portions in the same direction as the elongation direction of the base film 120 during a process for manufacturing the touch panel due to permeation of a chemical component such as a solvent, or the like, included in a second photosensitive coating composition used in a process for forming the transparent electrode pattern layer 130. However, according to an exemplary embodiment, the first passivation layer 140 is disposed on both end portions of the base film 120, thereby making it possible to prevent the generation of the crack in the end portions in the elongation direction of the base film 120 due to the permeation of the chemical component, such as the solvent, or the like, included in the second photosensitive coating composition during a photo-resist process.

Referring back to FIG. 1, a second passivation layer 220 is then formed on the first passivation layer 140. The second passivation layer 220 may include contact holes 225 exposing the first passivation layer 140. A voltage may be applied to the first passivation layer 140 exposed through the contact holes 225, such that a signal may be transferred to the transparent electrode pattern layer 130.

Here, the second passivation layer 220 may include an insulating material, for example, an inorganic material such as a silicon nitride ($SiN_x$), a silicon oxide ($SiO_2$), an aluminum oxide ($AlO_x$), or the like, or an organic material such as polyimide, polyester, acryl, or the like. The second passivation layer 220 may protect the transparent electrode pattern layer 130 and a wiring pattern layer 140b and insulate the transparent electrode pattern layer 130 and the wiring pattern layer 140b from another layer (see e.g., FIG. 21).

As described above, the touch panel according to an exemplary embodiment includes the first passivation layer 140 formed in the edge regions of the transparent electrode pattern layer 130 so as to cover the end portion side walls of the transparent electrode pattern layer 130, thereby making it possible to significantly decrease the generation of the crack in both end portions in the same direction as the elongation direction of the base film 120. That is, a cause of the crack generated due to permeation of a solvent component, or the like, included in a composition used to form a second photosensitive coating layer 210 in the process for forming the transparent electrode pattern layer 130 may be prevented.

Next, an example of a process for manufacturing the touch panel having the configuration shown in FIG. 1 will be described in detail with reference to FIGS. 3 to 10.

FIGS. 3 to 9 are cross-sectional views sequentially showing a process for forming the touch panel of FIG. 1.

Figure 3:
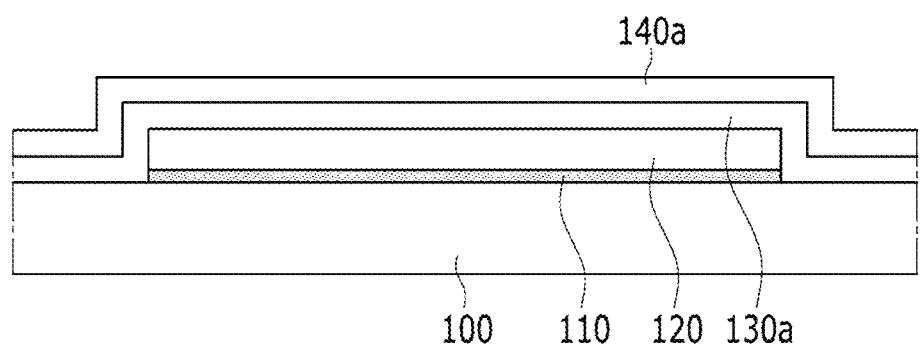
FIGS. 3, 4, 5, 6, 7, 8, and 9 sequentially show a process for forming the touch panel of FIG. 1.

As shown in FIG. 3, the base film 120 is attached onto a substrate 100 through an adhesive 110, and a transparent electrode layer 130a and a metal layer 140a are sequentially formed on the base film 120.

First, the substrate 100 may be a process substrate made of a firm material such as glass, a metal, or the like. That is, the material used for substrate 100 compensates for an easily-warped base film 120 that is used in order to manufacture a touch panel having high flexibility.

The base film 120 is attached onto the substrate 100 through the adhesive 110, and the above-mentioned transparent conductive oxide may be sputtered or deposited on the base film 120 to form the transparent electrode layer 130.

Next, the above-mentioned low resistance material may be sputtered or deposited on the transparent electrode layer 130a to form a metal layer 140a.

Figure 4:
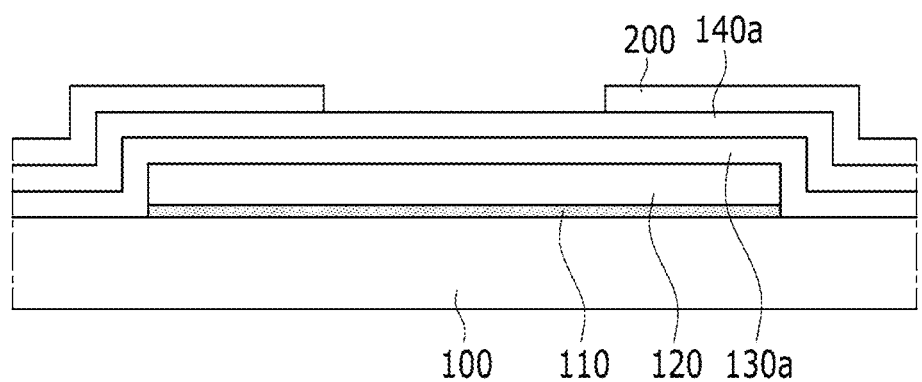

Then, as shown in FIG. 4, a first photosensitive coating layer 200 is formed on the metal layer 140a using at least one of, for example, a spin coating method, a slit coating method, an inkjet printing method, and a screen printing method. Then, the first photosensitive coating layer 200 is exposed, baked, and developed to form a first photosensitive pattern for forming the first passivation layer 140, as shown in FIG. 4.

Figure 5:
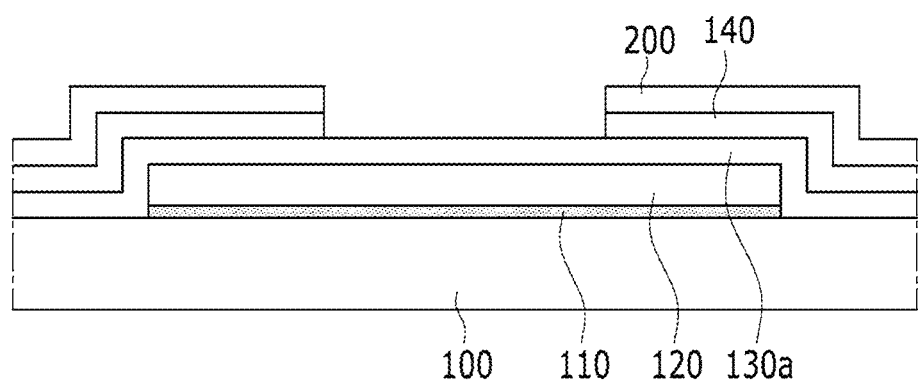

Next, the metal layer 140a is etched to form the first passivation layer 140 in edge regions of the transparent electrode layer 130a in order to cover end portion side walls of the transparent electrode layer 130a, as shown in FIG. 5.

Figure 6:
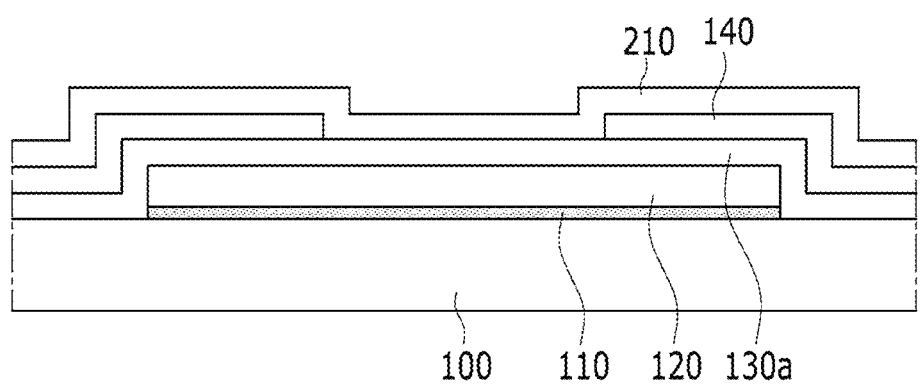

Then, as shown in FIG. 6, a second photosensitive coating layer 210 is formed on the first passivation layer 140 and the transparent electrode layer 130a using at least one of, for example, a spin coating method, a slit coating method, an inkjet printing method, and a screen printing method.

Figure 7:
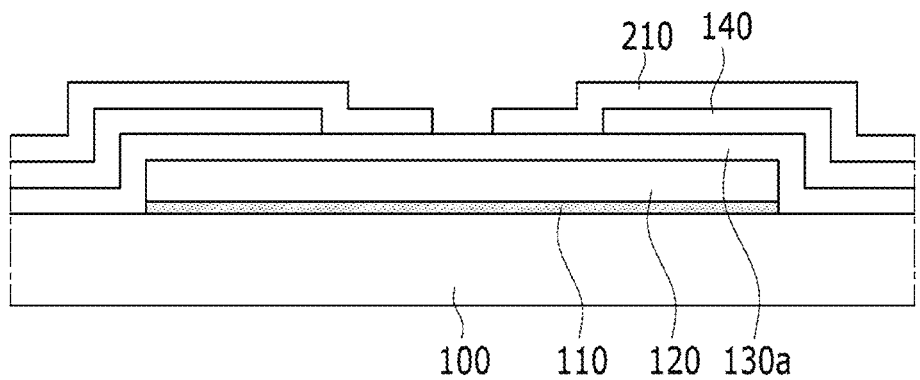
Figure 8:
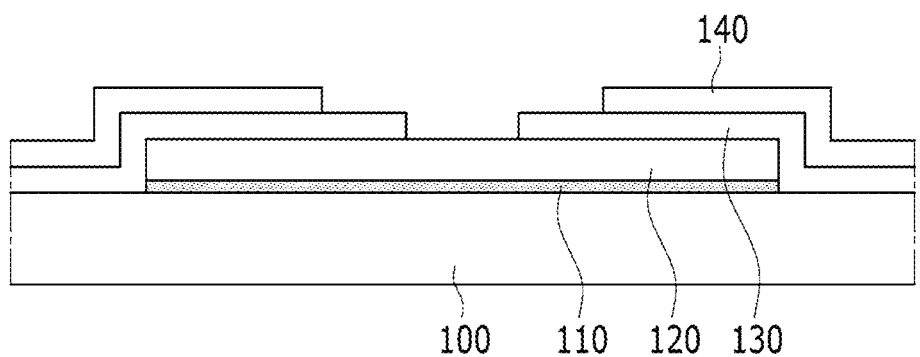

Next, as shown in FIG. 7, the second photosensitive coating layer 210 is exposed, baked, and developed to form a second photosensitive pattern for forming a transparent electrode pattern. Then, as shown in FIG. 8, the transparent electrode layer 130a is etched to form the transparent electrode pattern layer 130. Here, the etching may be performed by at least one of dry etch and wet etch.

Figure 9:
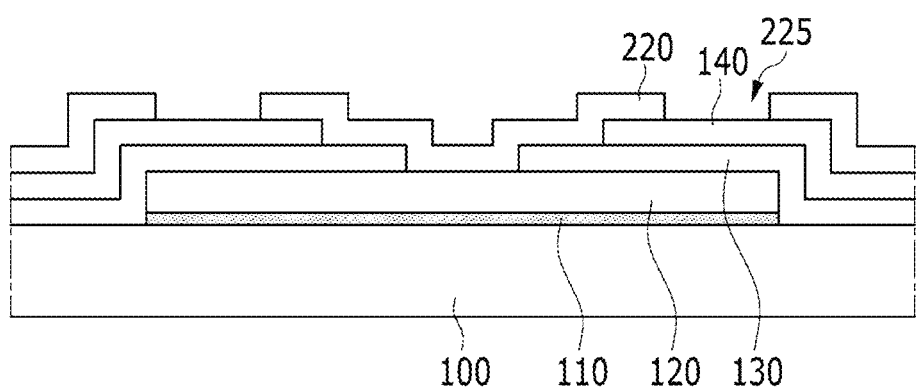

Then, as shown in FIG. 9, the second passivation layer 220 is formed on the transparent electrode pattern layer 130 and the first passivation layer 140. Then, portions of the second passivation layer 220 are etched so that the first passivation layer 140 is exposed, thereby forming the contact holes 225. Next, when the substrate 100 is removed, the touch panel having the structure as shown in FIG. 1 may be obtained.

Figure 10:
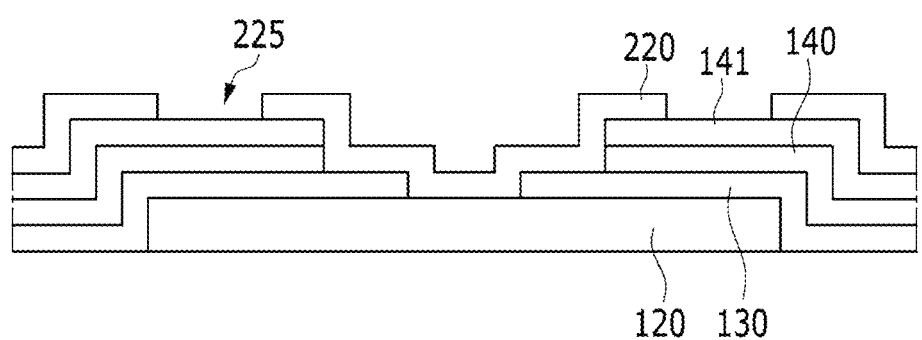
FIG. 10 shows a cross section of a touch panel according to another exemplary embodiment.

FIG. 10 shows a cross section of a touch panel according to another exemplary embodiment.

Referring to FIG. 10, the touch panel according to another exemplary embodiment may further include a third passivation layer 141 disposed on the first passivation layer 140. Here, since other components configuring the touch panel, such as the base film 120, the transparent electrode pattern layer 130, the first passivation layer 140, the contact holes 225, and the second passivation layer 220, are the same as those described above, a description therefore will be omitted.

The third passivation layer 141 may include an insulating material, for example, an inorganic material such as a silicon nitride ($SiN_x$), a silicon oxide ($SiO_2$), an aluminum oxide ($AlO_x$), or the like, or an organic material such as polyimide, polyester, acryl, or the like, but is not limited thereto.

FIGS. 11 to 17 are cross-sectional views sequentially showing a process for forming the touch panel of FIG. 10.

First, the base film 120 is attached onto the substrate 100 through an adhesive 110, and a transparent electrode layer 130a and a metal layer 140a are sequentially formed on the base film 120 by the same method as the above-mentioned method.

Figure 11:
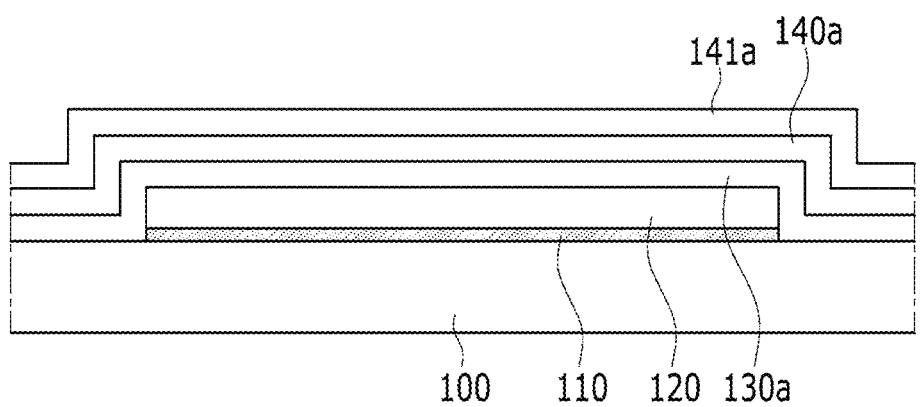
FIGS. 11, 12, 13, 14, 15, 16, and 17 sequentially show a process for forming the touch panel of FIG. 10.

Next, as shown in FIG. 11, a passivation layer 141a for forming the third passivation layer is formed on the metal layer 140a.

Figure 12:
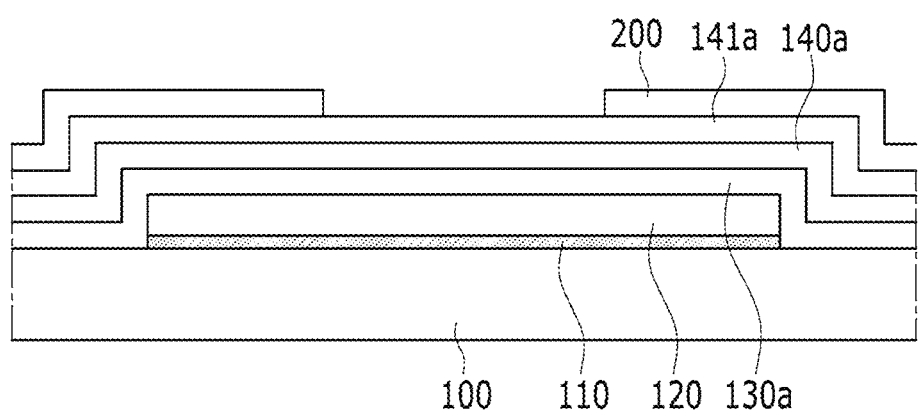

Then, as shown in FIG. 12, a first photosensitive coating layer 200 for forming the third passivation layer 141 is formed by the same method as the above-mentioned method.

Figure 13:
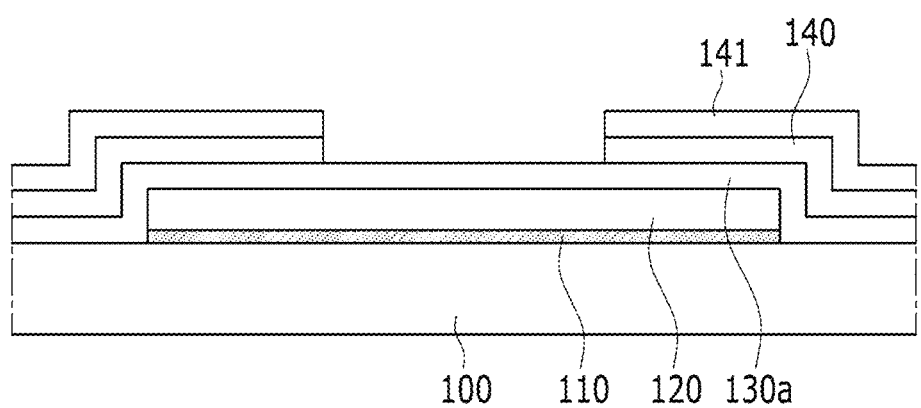

Next, as shown in FIG. 13, the passivation layer 141a and the metal layer 140a are etched to form the third passivation layer 141 and the first passivation layer 140. Here, the etching of the passivation layer 141a may be performed by, for example, dry etch, and the etching of the metal layer 140a may be performed by, for example, wet etch.

Figure 14:
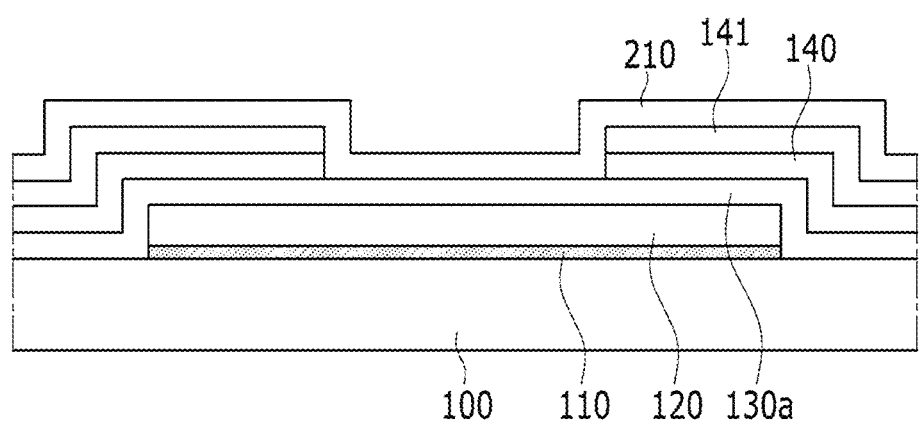
Figure 15:
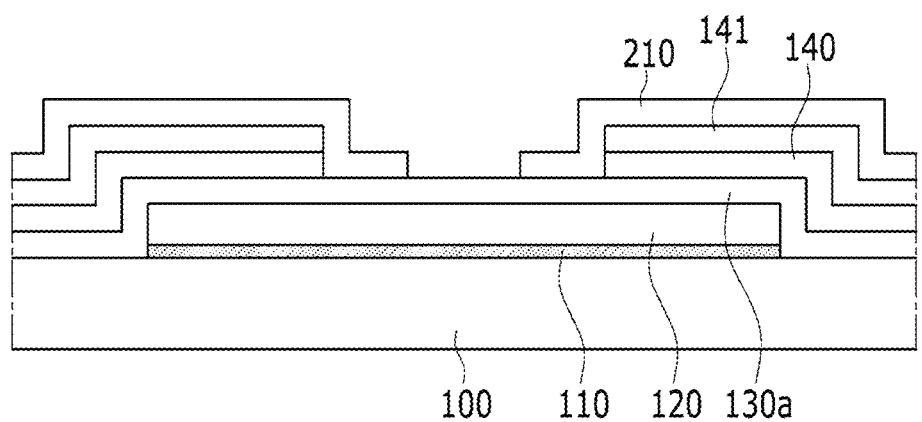

Next, as shown in FIG. 14, a second photosensitive coating layer 210 is formed on the third passivation layer 141 and the transparent electrode layer 130a. Then, as shown in FIG. 15, the second photosensitive coating layer 210 is exposed, baked, and developed to form a second photosensitive pattern for forming a transparent electrode pattern.

Figure 16:
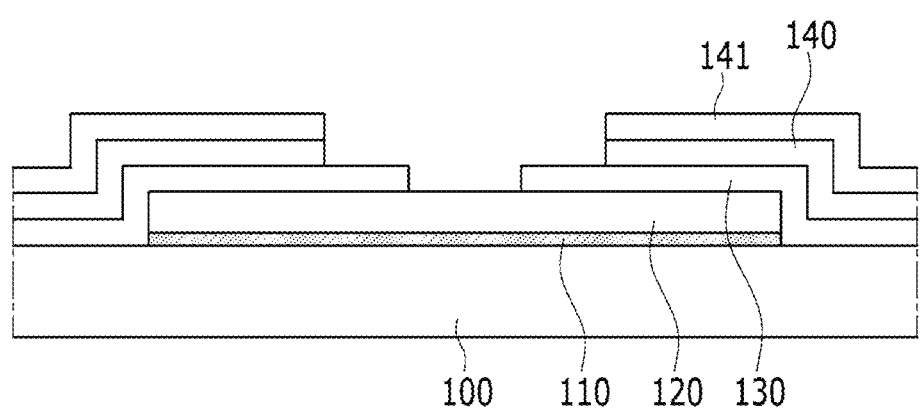

Next, as shown in FIG. 16, the transparent electrode layer 130a is etched to form the transparent electrode pattern layer 130.

Figure 17:
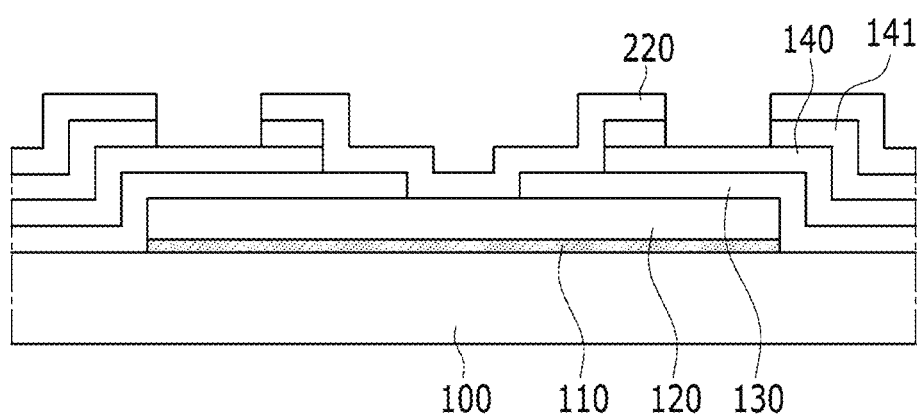

Then, as shown in FIG. 17, the second passivation layer 220 is formed on the transparent electrode pattern layer 130 and the third passivation layer 141, and both of the second passivation layer 220 and the third passivation layer 141 of corresponding portions are etched in order to form the contact holes 225, thereby exposing the first passivation layer 140. Next, when the substrate 100 is removed, the touch panel having the structure as shown in FIG. 10 may be obtained.

As described above, after the third passivation layer 141 is formed in edge regions of the transparent electrode layer 130a so as to cover end portion side walls of the transparent electrode layer 130a in a process for manufacturing the touch panel, the transparent electrode pattern layer 130 is formed. Accordingly, it is possible to significantly suppress generation of the crack in both end portions in the same direction as the elongation direction of the base film 120. Here, because the third passivation layer 141 is formed to have a very small thickness, it does not have an influence on the overall thickness of the touch panel.

A method for manufacturing the touch panel according to the present disclosure may also be performed as shown in FIGS. 18 to 21.

First, the base film 120 is attached to the substrate 100 through an adhesive 110, and a transparent electrode layer 130a and a metal layer 140a are sequentially formed on the base film 120, by the same method as the above-mentioned method.

Figure 18:
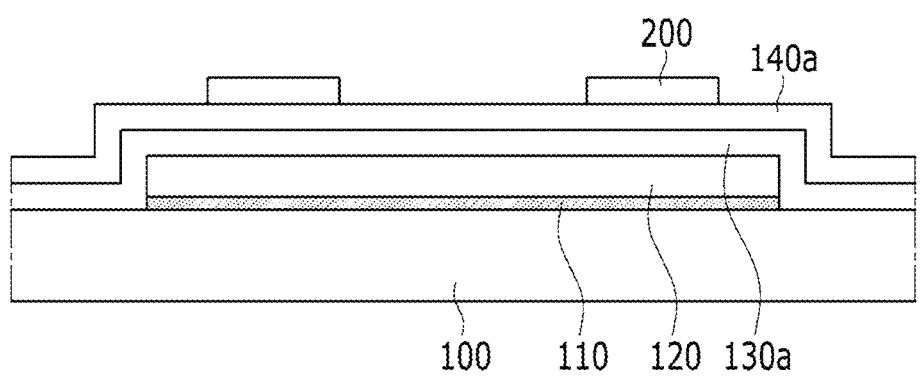
FIGS. 18, 19, 20, and 21 sequentially show another example of a process for forming the touch panel according to yet another exemplary embodiment.
Figure 19:
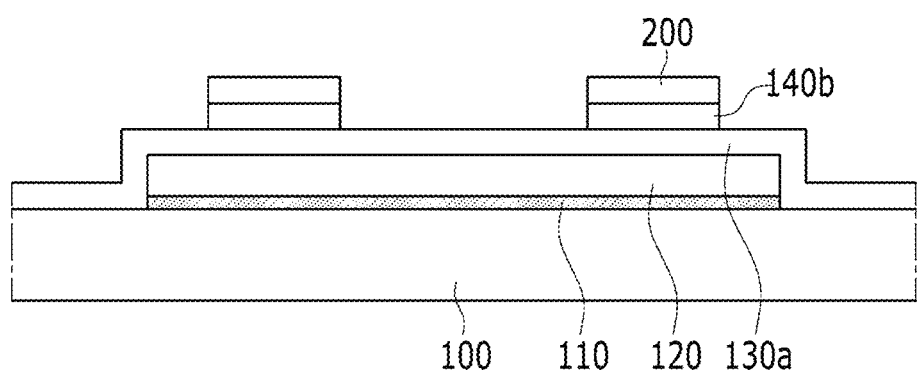

Next, as shown in FIG. 18, a first photosensitive coating layer 200 for forming wiring patterns is formed on the metal layer 140a. Then, as shown in FIG. 19, the metal layer 140a is etched to form a wiring pattern layer 140b.

Figure 20:
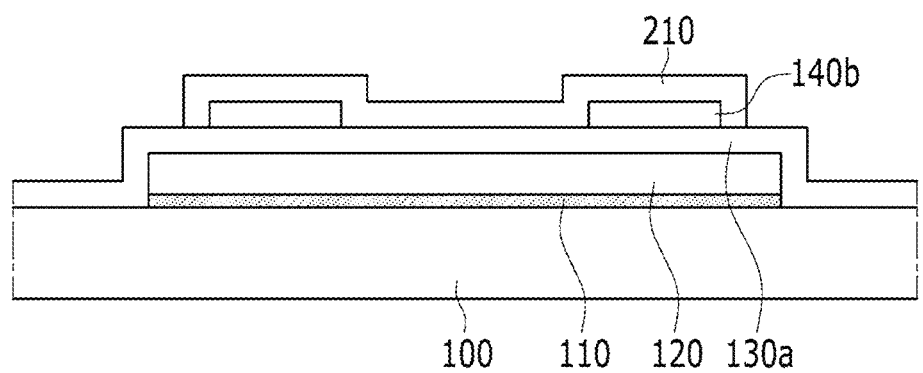

Next, a second photosensitive coating layer 210 is formed on the wiring pattern layer 140b and the transparent electrode layer 130a. The second photosensitive coating layer 210 is formed so that it covers the wiring pattern layer 140b and a region in which the second photosensitive coating layer 210 is not formed is included in region near an edge of the transparent electrode layer 130a, as shown in FIG. 20.

To this end, the second photosensitive coating layer 210 may be formed by slit coating. In the slit coating process, a coating layer may be formed at position using a device including a stage and a slit nozzle part. Therefore, in order for the second photosensitive coating layer 210 not to be formed in the predetermined region from the edge of the transparent electrode layer 130a, as described above, the second photosensitive coating layer 210 may be formed using a slit coating process.

Next, the second photosensitive coating layer 210 is exposed, baked, and developed to form a second photosensitive pattern for forming the transparent electrode pattern layer 130. Then, the transparent electrode layer 130a is etched to form the transparent electrode pattern layer 130.

Since a detailed method thereof is the same as the above-mentioned method, a description therefore will be omitted.

Figure 21:
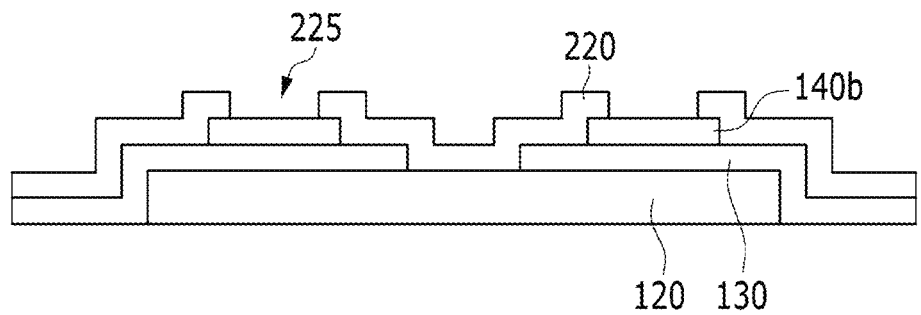

Next, as shown in FIG. 21, the second passivation layer 220 passivating the transparent electrode pattern layer 130 and the wiring pattern layer 140b is formed.

In the case of manufacturing the touch panel by the method as described above, since the second photosensitive coating layer 210 is not formed in the edge region of the transparent electrode layer 130a covering the end portions of the base film 120, a chemical component, or the like, used at the time of forming the coating layer does not permeate into the base film 120, thereby making it possible to significantly decrease the generation of the crack in the end portions of the base film 120.

Hereinafter, the present disclosure will be described in more detail through detailed Inventive Examples.

Inventive Example 1

A uni-axially oriented polycarbonate film was attached to a glass substrate using an adhesive, AgNw and an ITO were deposited on the uni-axially oriented polycarbonate film to form a transparent electrode layer, and Cu was sputtered on the transparent electrode layer to form a Cu layer.

Next, a first photosensitive coating layer was formed on the Cu layer using a spin coater, was exposed, baked, and developed to form a first photosensitive pattern layer for forming a first passivation layer, and the Cu layer was etched to form the first passivation layer so as to cover end portion side walls of the transparent electrode layer.

Next, a second photosensitive coating layer was formed on the first passivation layer and the transparent electrode layer using a spin coater, and was exposed, baked, and developed to form a second photosensitive pattern for forming a transparent electrode pattern layer. Then, the transparent electrode layer was etched, and a second passivation layer was formed using $SiN_X$ and was then etched to form contact holes exposing portions of the first passivation layer, thereby manufacturing a touch panel.

Inventive Example 2

A touch panel was manufactured by the same method as the method according to Inventive Example 1 except that after $SiN_X$ is sputtered on the Cu layer to form a third passivation layer, the first photosensitive coating layer is formed, the second passivation layer is formed using the same $SiN_X$, and the second passivation layer and the third passivation layer are etched to form the contact holes exposing the portions of the first passivation layer.

Inventive Example 3

A uni-axially oriented polycarbonate film were attached onto a glass substrate using an adhesive, AgNw and an ITO was deposited on the uni-axially oriented polycarbonate film to form a transparent electrode layer, and Cu was sputtered on the transparent electrode layer to form a Cu layer.

Next, a first photosensitive coating layer was formed on the Cu layer using a spin coater, and was exposed, baked, and developed to form a wiring pattern layer.

Then, a second photosensitive coating layer was formed on the transparent electrode layer and the wiring pattern layer except for predetermined regions of an edge of the transparent electrode layer, as shown in FIG. 19, using a slit coating device.

The second photosensitive coating layer was exposed, baked, and developed to form a second photosensitive pattern for forming a transparent electrode pattern layer. Then, the transparent electrode layer was etched, a second passivation layer was formed using $SiN_X$, and portions of the second passivation layer were etched so that the wiring pattern layer is exposed, thereby manufacturing a touch panel.

Comparative Example 1

A uni-axially oriented polycarbonate film were attached onto a glass substrate using an adhesive, AgNw and an ITO was deposited on the uni-axially oriented polycarbonate film to form a transparent electrode layer, and Cu was sputtered on the transparent electrode layer to form a Cu layer.

Next, a first photosensitive coating layer was formed on the Cu layer using a spin coater, and was exposed, baked, and developed to form a wiring pattern layer.

Then, a second photosensitive coating layer was formed on the transparent electrode layer and the wiring pattern layer using a spin coater, and was exposed, baked, and developed to form a second photosensitive pattern for forming a transparent electrode pattern layer. Then, the transparent electrode layer was etched, a second passivation layer was formed using $SiN_X$, and portions of the second passivation layer were etched so that the wiring pattern layer is exposed, thereby manufacturing a touch panel.

Measurement of Whether or not Crack is Generated

In order to observe whether or not a crack is generated at both ends of base films of touch panels manufactured according to Inventive Examples 1 to 3 and Comparative Example 1, end portions of the base films were enlarged and photographed using a microscope. Results were shown in the following Table 1 and FIGS. 22 to 25.

TABLE 1

| Division | Vertical Distance of Region in Which Crack Is Generated from One End Portion of Base Film |
|---|---|
| Inventive Example 1 | 2 mm or less |
| Inventive Example 2 | 1 mm or less |
| Inventive Example 3 | 1 mm or less |
| Comparative Example 1 | 1 cm or more |

Figure 22:
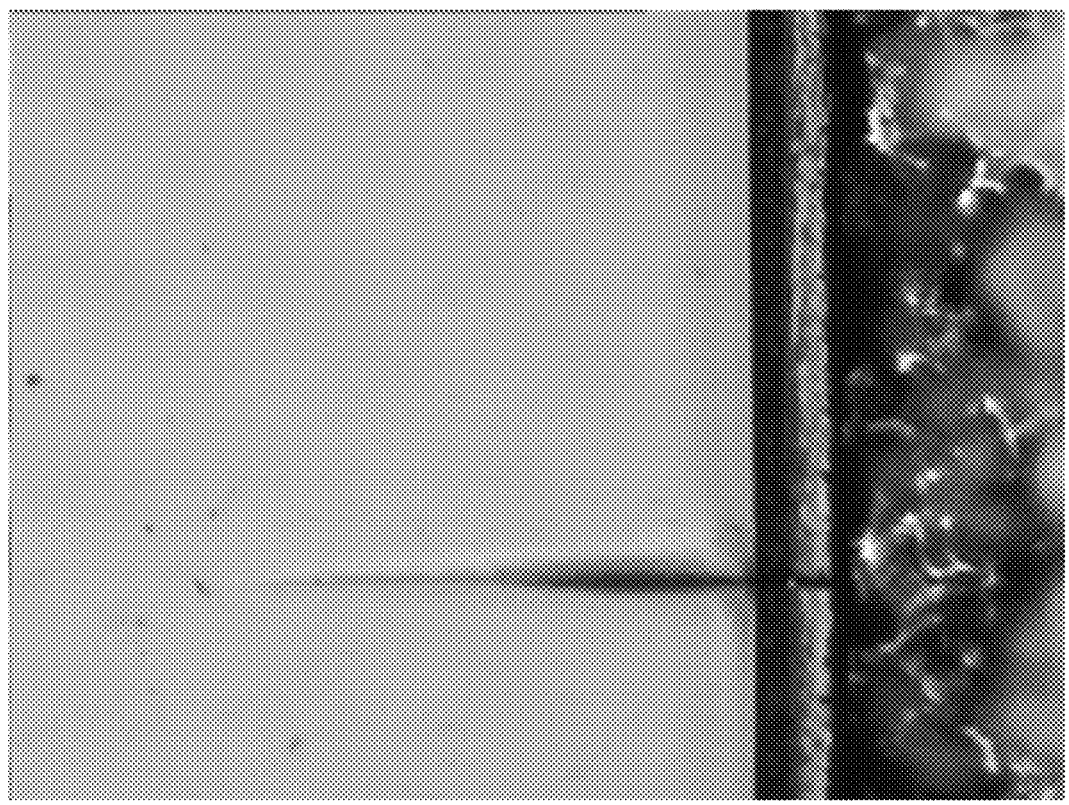
FIGS. 22, 23, and 24 are enlarged photographs of an edge region of a transparent electrode pattern layer in a touch panel manufactured according to Inventive Examples 1 to 3.
Figure 23:
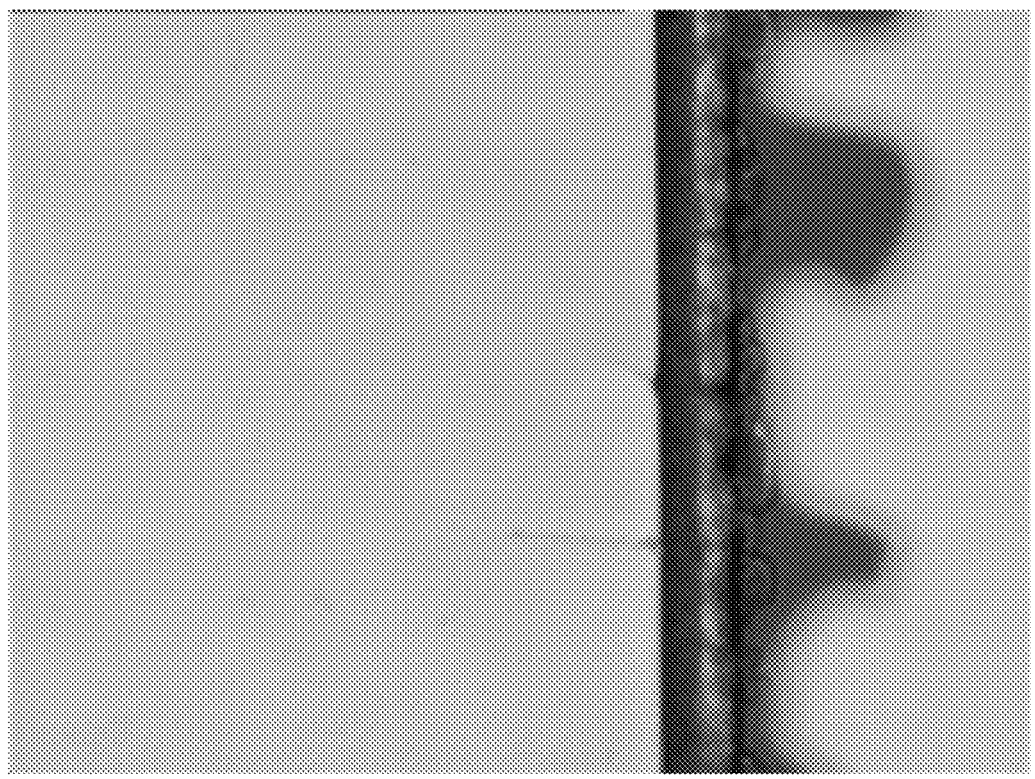
Figure 24:
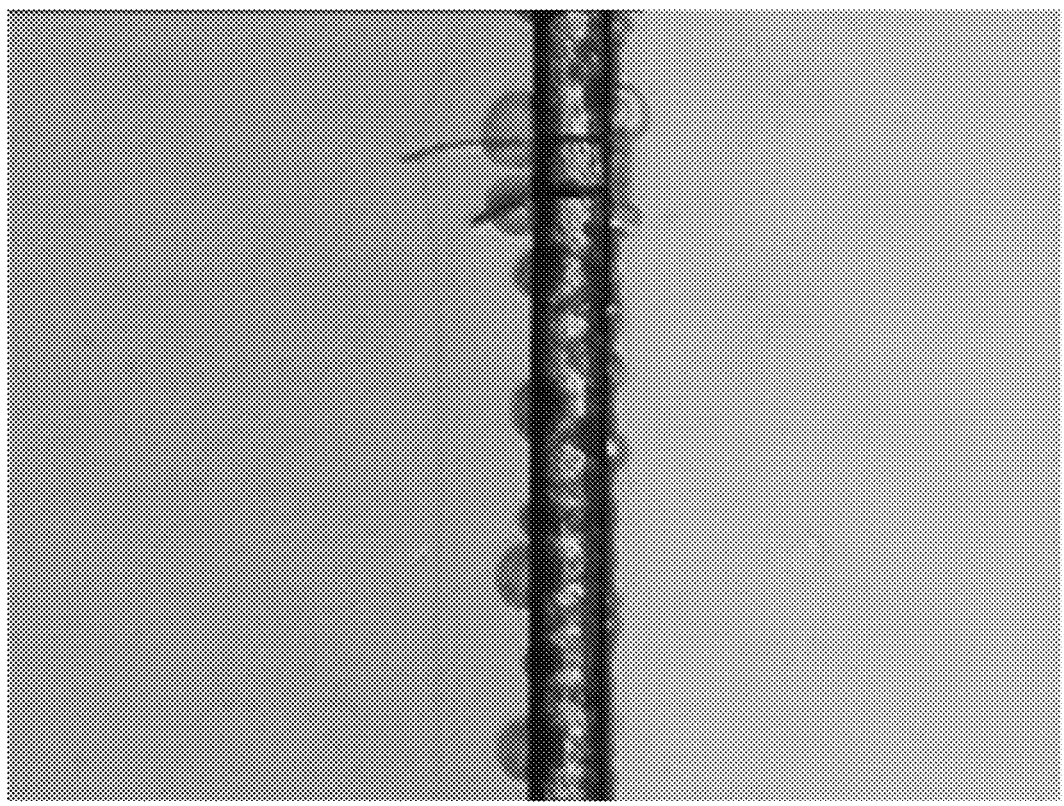

As shown in Table 1 and FIGS. 22 to 24, in the case of the touch panels manufactured according to Inventive Examples 1 to 3, that is, by a method in which a layer capable of protecting the end portion of the base film is used or a region in which the second photosensitive coating layer for forming the transparent electrode pattern layer is not formed at the end portion of the base film is included according to the present disclosure, a region in which the crack is generated is not substantially present in the end portion of the base film.

Figure 25:
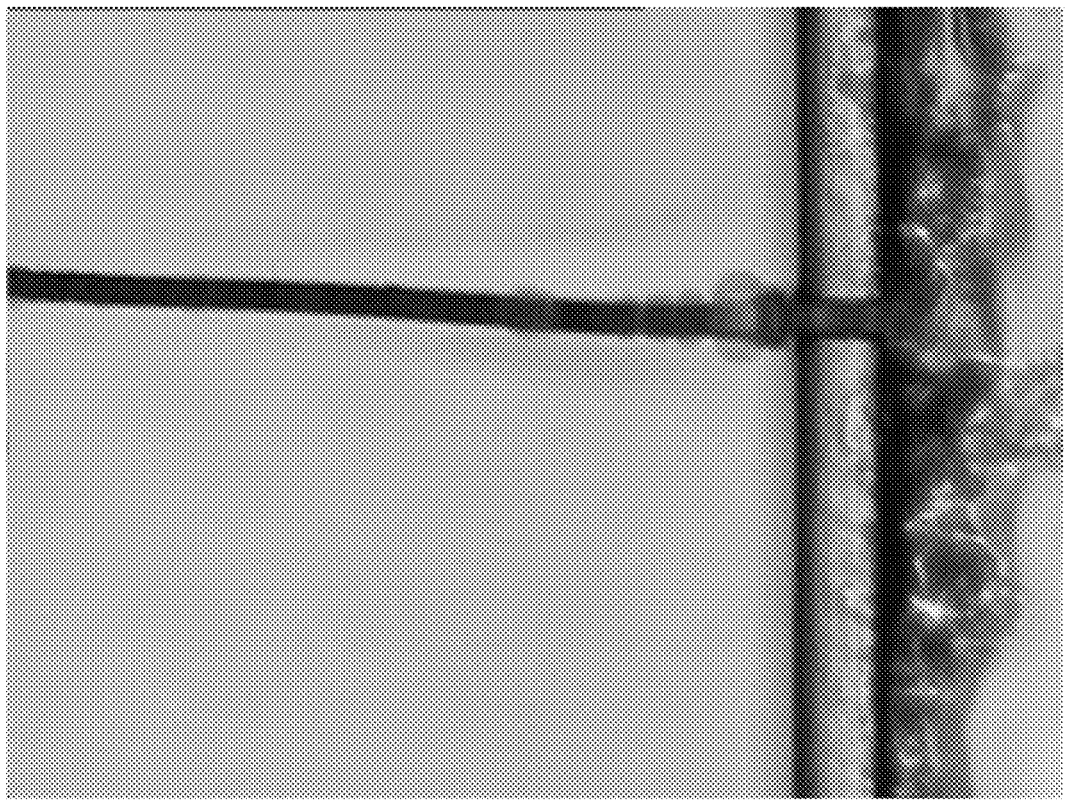
FIG. 25 is an enlarged photograph of an edge region of a transparent electrode pattern layer in a touch panel manufactured according to Comparative Example 1.

On the other hand, as shown in Table 1 and FIG. 25, in the case of the touch panel manufactured according to Comparative Example 1, that is, by a method of forming the second photosensitive coating layer on the entire region of the transparent electrode layer and then etching the second photosensitive coating layer, without forming a separate layer for protecting the end portion of the base film, the crack is generated over a wide region of the end portion of the base film.

In the method for manufacturing a touch panel according to the present disclosure, it is possible to effectively prevent the crack from being generated in both end portions in the same direction as the elongation direction of the base film included in the touch panel.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A touch panel, comprising:
   a uni-axially oriented base film extending in an elongation direction;
   a transparent electrode pattern layer disposed on the uni-axially oriented base film;
   a first passivation layer disposed in an edge region of the transparent electrode pattern layer and covering end portion side walls of the transparent electrode pattern layer;
   a second passivation layer on the first passivation layer; and
   a contact hole formed in the second passivation layer and exposing the first passivation layer,
   wherein the edge region of the transparent electrode pattern layer comprises a first edge and a second edge that is at an opposite end from the first edge in the elongation direction.

2. The touch panel of claim 1, further comprising a third passivation layer disposed on the first passivation layer.

3. The touch panel of claim 2, wherein the third passivation layer comprises at least one of an organic material and an inorganic material.

4. The touch panel of claim 1, wherein the uni-axially oriented base film comprises at least one of a polycarbonate film, a polyethylene terephthalate film, a polyethylene naphthalate film, a polyarylate film, a polyetherimide film, a polyethersulfone film, and a polyimide film.

5. The touch panel of claim 1, wherein the first passivation layer comprises at least one of molybdenum (Mo), silver (Ag), titanium (Ti), copper (Cu), and aluminum (Al).

6. A method for manufacturing a touch panel, comprising:
   sequentially forming a transparent electrode layer and a metal layer on a uni-axially oriented base film disposed on a substrate;
   forming a first photosensitive coating layer on the metal layer;
   forming a first passivation layer in edge regions of the transparent electrode layer using the first photosensitive coating layer so as to cover end portion side walls of the transparent electrode layer;
   forming a second photosensitive coating layer on the first passivation layer and the transparent electrode layer;
   patterning the transparent electrode layer using the second photosensitive coating layer to form a transparent electrode pattern layer; and
   forming a second passivation layer on the transparent electrode pattern layer and the first passivation layer, the second passivation layer comprising a contact hole exposing the first passivation layer.

7. The method for manufacturing a touch panel of claim 6, wherein the forming of the second photosensitive coating layer is performed by at least one of a spin coating method, a slit coating method, an inkjet printing method, and a screen printing method.

8. A method for manufacturing a touch panel, comprising:
   sequentially forming a transparent electrode layer and a metal layer on a uni-axially oriented base film disposed on a substrate,
   forming a first photosensitive coating layer on the metal layer;
   forming a first passivation layer in edge regions of the transparent electrode layer using the first photosensitive coating layer so as to cover end portion side walls of the transparent electrode layer;
   forming a third passivation layer on the first passivation layer;
   forming the second photosensitive coating layer on the third passivation layer and the transparent electrode layer;
   patterning the transparent electrode layer using the second photosensitive coating layer to form the transparent electrode pattern layer; and
   forming the second passivation layer on the transparent electrode pattern layer and the third passivation layer, the second passivation layer comprising the contact hole exposing the third passivation layer.

9. A method for manufacturing a touch panel, comprising:
   forming a uni-axially oriented base film on a substrate;
   sequentially forming a transparent electrode layer and a metal layer on the uni-axially oriented base film;
   forming a first photosensitive coating layer on the metal layer;
   patterning the metal layer using the first photosensitive coating layer to form a wiring pattern layer;
   forming a second photosensitive coating layer on the wiring pattern layer and the transparent electrode layer;
   patterning the transparent electrode layer using the second photosensitive coating layer to form a transparent electrode pattern layer; and
   forming a second passivation layer on the wiring pattern layer and the transparent electrode pattern layer, the second passivation layer comprising a contact hole exposing the wiring pattern layer,
   wherein the forming of the second photosensitive coating layer is performed so that the second photosensitive coating layer is configured to cover the wiring pattern layer and a region in which the second photosensitive coating layer is not formed is an edge of the transparent electrode layer.

10. The method for manufacturing a touch panel of claim 9, wherein the forming of the second photosensitive coating layer is performed by slit coating.

11. The method for manufacturing a touch panel of claim 9, wherein the uni-axially oriented base film is at least one of a polycarbonate film, a polyethylene terephthalate (PET) film, a polyethylene naphthalate film, a polyarylate film, a polyetherimide film, a polyethersulfone film, and a polyimide film.

* * * * *